(12) United States Patent  
Fukuhara et al.

(10) Patent No.: US 8,409,704 B2  
(45) Date of Patent: Apr. 2, 2013

(54) PREPREG, PRINTED WIRING BOARD, MULTILAYER CIRCUIT BOARD, AND PROCESS FOR MANUFACTURING PRINTED WIRING BOARD

(75) Inventors: Yasuo Fukuhara, Osaka (JP); Tomoaki Watanabe, Mino (JP); Mao Yamaguchi, Koriyama (JP); Yuki Kitai, Moriguchi (JP); Hiroaki Fujiwara, Ikoma (JP)

(73) Assignee: Panasonic Corporation, Osaka (JP)

( * ) Notice: Subject to any disclaimer, the term of this patent is extended or adjusted under 35 U.S.C. 154(b) by 679 days.

(21) Appl. No.: 12/523,775

(22) PCT Filed: Jan. 25, 2007

(86) PCT No.: PCT/JP2007/051166  
§ 371 (c)(1),  
(2), (4) Date: Jul. 20, 2009

(87) PCT Pub. No.: WO2008/090614  
PCT Pub. Date: Jul. 31, 2008

(65) Prior Publication Data  
US 2010/0044087 A1    Feb. 25, 2010

(51) Int. Cl.  
*B32B 7/12* (2006.01)

(52) U.S. Cl. ............. 428/355 EP; 428/344; 428/355 R; 428/414; 428/416; 428/209; 174/258; 174/259; 156/153; 205/126; 205/205

(58) Field of Classification Search ............. 428/209, 428/901, 355 EP, 344, 355 R, 414, 416; 174/258–259; 156/153; 205/126, 205  
See application file for complete search history.

(56) References Cited

U.S. PATENT DOCUMENTS

| | | | | |
|---|---|---|---|---|
| 4,751,146 A | * | 6/1988 | Maeda et al. | 428/475.8 |
| 5,290,883 A | * | 3/1994 | Hosokawa et al. | 525/423 |
| 5,352,745 A | * | 10/1994 | Katayose et al. | 525/391 |
| 5,670,250 A | * | 9/1997 | Sanville et al. | 428/323 |
| 5,948,514 A | * | 9/1999 | Komori et al. | 428/209 |

(Continued)

FOREIGN PATENT DOCUMENTS

| | | |
|---|---|---|
| JP | 3-119025 | 5/1991 |
| JP | 11-080506 | 3/1999 |

(Continued)

OTHER PUBLICATIONS

Taiwan Office action that issued with respect to related Tawanese Patent Application No. 097102456, mail date is Feb. 8, 2012.

*Primary Examiner* — Cathy Lam  
(74) *Attorney, Agent, or Firm* — Greenblum & Bernstein, P.L.C.

(57) ABSTRACT

The invention relates to a prepreg, obtained by impregnating a base material with an epoxy resin composition containing an epoxy resin (A), a curing agent (B), an accelerator (C), a phenoxy resin (D), and an inorganic filler (E) and semi-hardening the impregnated material, wherein the inorganic filler (E) has an average particle diameter of 3 µm or less. When a circuit with a narrow wire distance is formed on a surface of a insulator substrate composed of such a prepreg by using a method of forming the circuit by plating process, an amount of the plating remaining on the insulator substrate surface at the circuit contour periphery can be reduced. As a result, it leads to stabilization of inter-circuit insulation resistance and increase in a yield during production of printed wiring boards.

10 Claims, 8 Drawing Sheets

U.S. PATENT DOCUMENTS

| | | | |
|---|---|---|---|
| 5,965,245 A * | 10/1999 | Okano et al. | 428/209 |
| 5,985,431 A | 11/1999 | Oosedo et al. | |
| 6,403,221 B1 | 6/2002 | Nakamura et al. | |
| 6,528,559 B1 * | 3/2003 | Nakacho et al. | 524/116 |
| 6,805,958 B2 | 10/2004 | Nakamura et al. | |
| 7,179,552 B2 | 2/2007 | Nakamura et al. | |
| 7,825,198 B2 * | 11/2010 | Arima et al. | 525/533 |
| 2002/0187353 A1 | 12/2002 | Nakamura et al. | |

FOREIGN PATENT DOCUMENTS

| | | |
|---|---|---|
| JP | 2001-181375 | 7/2001 |
| JP | 2005-002227 | 1/2005 |
| JP | 2005-154727 | 6/2005 |
| JP | 2005-336426 | 12/2005 |
| JP | 2006-028274 | 2/2006 |
| WO | 2005/104638 | 11/2005 |

* cited by examiner

A

B

C

D

PREPREG, PRINTED WIRING BOARD, MULTILAYER CIRCUIT BOARD, AND PROCESS FOR MANUFACTURING PRINTED WIRING BOARD

TECHNICAL FIELD

The present invention relates to a prepreg for use in production of printed wiring boards. In particular, it relates to a prepreg favorably used for production of printed wiring boards having a fine circuit formed by plating process.

BACKGROUND ART

A process for producing printed wiring boards in which an electrically conductive layer is formed only by plating without using a copper foil as the electrically conductive layer has been known as the method of forming a circuit with a narrow wire distance (e.g., Patent Document 1). Hereinafter, this method will be described specifically (hereinafter, such a method will be referred to also as the "method of forming a circuit by plating process").

First as shown in FIG. 7A, a multilayer circuit board 43 is obtained by lamination molding of prepregs 41 and an internal-layer circuit board 42 having an internal layer circuit 42a formed, and the surface 43a thereof is subjected to a roughening treatment with an oxidizing agent such as potassium permanganate. The roughening treatment is carried out for improvement in the peel strength to an electroless plating layer formed on the surface 43a of the multilayer circuit board 43. Then as shown in FIG. 7B, a hole 44a for forming a through hole 44 is formed in the multilayer circuit board 43. As shown in FIG. 7C, the surface of the hole 44a is made conductive by an electroless plating treatment of the multilayer circuit board 43 having the hole therein, and simultaneously, an electroless plating layer 45 is formed on the surface 43a of the multilayer circuit board 43. Then as shown in FIG. 7D, an electrolytic plating layer 46 is formed on the electroless plating layer 45 by an electrolytic plating treatment. As shown in FIG. 8A, a resist 47 is then formed in the circuit-forming region on the electrolytic plating layer 46. Then as shown in FIG. 8B, regions of the electrolytic plating layer 46 and the electroless plating layer 45 on which the resist 47 is not formed are removed. As shown in FIG. 8C, removal of the resist 47 for example with an alkaline solution gives a multilayer printed wiring board 50 having an external layer circuit 48 formed.

According to such a method, because the thickness of the electrically conductive layer is equivalent only to the thickness of the electroless plating layer 45 and the electrolytic plating layer 46, it is possible to form a thin electrically conductive layer, for example of approximately 20 μm in thickness. In forming a circuit with a narrow wire distance by etching such a thin electrically conductive layer, because the thickness of the electrically conductive layer is small, the etchant easily reaches the insulator substrate surface, resulting in reducing residual of the conductor on the insulator substrate surface and assuring preservation of the interwire insulation sufficiently. However, mass production of the printed wiring board by using such a plating process had a problem of low yield. Specifically when the insulation resistance between non-conductive circuits is measured during a quality inspection for the multilayer printed wiring board obtained, the insulation resistance fluctuated significantly, and it was thus difficult to obtain a printed wiring board having an insulation resistance larger than its standard value. Patent Document 1: WO2005/104638

SUMMARY OF THE INVENTION

An object of the present invention is to provide a prepreg that is used as an insulator substrate for the printed wiring boards having a circuit formed by plating process and that gives the printed wiring boards at a high yield during mass production.

An aspect of the present invention is a prepreg, obtained by impregnating a base material with an epoxy resin composition containing an epoxy resin (A), a curing agent (B), an accelerator (C), a phenoxy resin (D), and an inorganic filler (E) and semi-hardening the impregnated material, characterized in that the inorganic filler (E) has an average particle diameter of 3 μm or less.

The object, characteristics, aspects and advantages of the present invention will become more evident in the following detailed description.

BEST MODE OF CARRYING OUT THE INVENTION

Figure 1A:
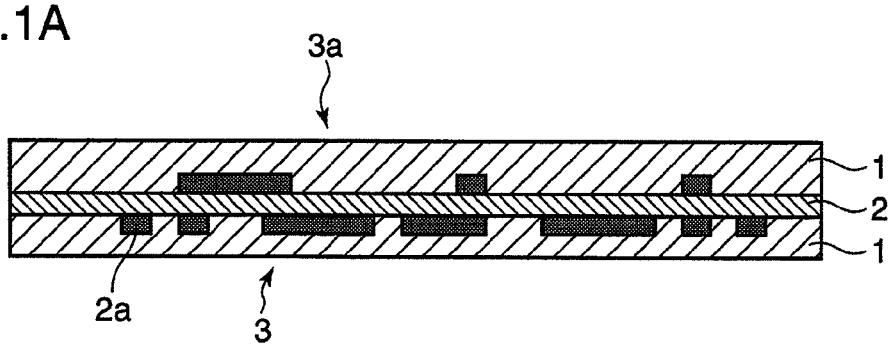
FIGS. 1A to 1D are schematic cross-sectional views showing the earlier steps of a multilayer process for production of the printed wiring board in an embodiment of the present invention.

Hereinafter, embodiments of the present invention will be described.

The prepreg in the present embodiment is a prepreg prepared by impregnating a base material with an epoxy resin composition containing an epoxy resin (A), a curing agent (B), an accelerator (C), a phenoxy resin (D) and an inorganic filler (E) and semi-hardening the impregnated product, wherein the inorganic filler (E) has an average particle diameter of 3 μm or less.

The inventors have found that, when a circuit with a narrow wire distance is formed by the method of forming a circuit by plating process, the contour of the formed circuit is indistinct. It was considered that the reason for it was fluctuation in the amount of the plating remaining on the insulator substrate surface at circuit contour periphery, and specifically that the fluctuation in residual amount lead to fluctuation in the intercircuit insulation resistance and decrease in the yield of printed wiring board. Further studies resulted in a finding that there was a great amount of plating remaining on a surface of the dent that was formed by separation of an inorganic filler contained in a prepreg.

After intensive studies on the basis of these findings, the inventors have found that it was possible to reduce the residual amount of the plating at circuit contour periphery by controlling the particle diameter of the inorganic filler contained in the prepreg, and thus made the present invention.

Examples of the epoxy resins (A) used in the present embodiment include bisphenol-type epoxy resins such as bisphenol A-type epoxy resins and bisphenol F-type epoxy resins, novolak-type epoxy resins such as cresol novolak-type epoxy resins and phenol novolak-type epoxy resin, epoxy resins such as biphenyl-type epoxy resins and dicyclopentadiene-type epoxy resins, and the like.

Particularly favorable examples of the epoxy resins (A) include phosphorus-modified epoxy resins (A1) having an epoxy resin mainly as the molecule skeleton and containing phosphorus atoms in the molecule. Such phosphorus-modified epoxy resins are used favorably as halogen-free flame-retardant epoxy resins. Typical examples thereof include FX289 and FX305 produced by Tohto Kasei Co., Ltd., and the like. These resins may be used alone or in combination of two or more.

The content of the epoxy resin (A) is preferably 20 to 90 mass %, more preferably 40 to 80 mass %, in the entire epoxy resin composition.

The epoxy resin composition used in the present embodiment contains a curing agent (B) for hardening the epoxy resin (A). The curing agent (B) is, for example, an amino-based curing agent, a phenol-based curing agent, or the like. In particular, a phenol-based curing agent (B1) is used favorably, because it raises the heat resistance of the hardened prepreg product.

Typical examples of the phenol-based curing agents (B1) include phenol novolak resins, phenol aralkyl resins, bisphenol A novolak resins, cresol novolak resins, tetrabromobisphenol A novolak resins and the like. These various curing agents may be used alone or in combination of two or more.

The curing agent (B) is preferably blended in an amount of 0.6 to 1.5 equivalences with respect to 1 equivalence of the epoxy group in the epoxy resin contained in the epoxy resin (A).

The epoxy resin composition in the present embodiment contains an accelerator (C) for acceleration of the hardening of the epoxy resin (A).

Typical examples of the accelerator (C) include imidazole compounds such as 2-ethyl-4-methylimidazole, tertiary amine compounds, guanidines, or the epoxy adducts and microcapsulated products thereof, as well as organic phosphine compounds such as triphenylphosphine, tetraphenylphosphonium and tetraphenyl borate, DBU or the derivatives thereof, and the like. These compounds may be used alone or in combination of two or more.

The epoxy resin composition used in the present embodiment contains a phenoxy resin (D) additionally. If an insulator substrate composed of hardened prepreg product is processed with an oxidizing agent such as potassium permanganate, the phenoxy resin (D) is dissolved. As a result, the surface of the insulator substrate is roughened, leading to increase in peel strength of the plating layer formed on the insulator substrate surface.

The phenoxy resin (D) is a resin having phenoxy groups or the derivative groups thereof as the skeleton. It is produced by a known method of reacting a bisphenol compound or the derivative thereof with epichlorohydrin or the derivative thereof. The bisphenol compound used is, for example, bisphenol A, bisphenol F, bisphenol S, or the mixture thereof.

Particularly favorable examples of the phenoxy resins (D) include phosphorus-modified phenoxy resins (D1) having an above-mentioned phenoxy resin mainly as the molecule skeleton and containing phosphorus atoms in the molecule. Such phosphorus-modified phenoxy resins are used favorably, because they are superior in the balance among peel strength, flame resistance and heat resistance.

A phenoxy resin (D2) having the skeletons represented by the following General Formula (1) and/or General Formula (2) as its molecule skeleton is particularly favorable, because it is superior in dielectric dissipation factor in the high-frequency region.

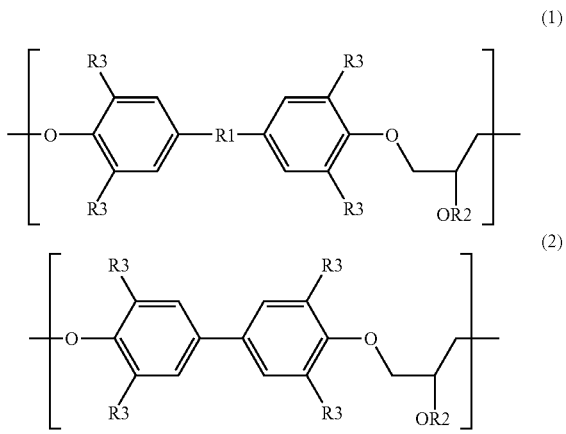

(in Formulae (1) and (2), R1 represents an alkylene group or —$SO_2$—; R2 represents a linear or cyclic carbonyl group having a carbon number of 1 to 20 or aromatic carbonyl group at a rate of 5 to 99 mol % and a hydrogen atom at a rate of 1 to 95 mol %; and R3 represents a hydrogen atom or a methyl group).

Typical examples of the phenoxy resins (D) include E1255HX30 (bisphenol A skeleton), E1256B40 (bisphenol A skeleton), E4256H40 (bisphenol F skeleton) and bromine atom-containing E5580BPX40, YX8100BH30 and YL6954BH30, produced by Japan Epoxy Resins Co., Ltd., phosphorus-modified phenoxy resin ERF001 produced by Tohto Kasei Co., Ltd., RX200 (phenoxy resin (D2)) produced by Taiyo Ink Mfg. Co., Ltd., and the like. These resins may be used alone or in combination of two or more.

The content of the phenoxy resin (D) is preferably 5 to 15 mass % in the epoxy resin composition excluding the inorganic filler (E), in terms of sufficient increase in peel strength without significant decrease in heat resistance.

The epoxy resin composition used in the present embodiment contains an inorganic filler (E) having an average particle diameter of 3 μm or less. The average particle diameter means a median diameter, as determined with a particle size distribution meter.

If the inorganic filler (E) has an average particle diameter of 3 μm or less, it reduces residual of the plating in the circuit contour peripheral area when the circuit is formed by etching the plating layer formed on the insulator substrate surface, and consequently leads to improvement in the yield of the printed wiring board. If the inorganic filler (E) has an average particle diameter of more than 3 μm, it facilitates residual of the plating in the circuit contour peripheral area during circuit formation by etching. The resulting residual of the plating leads to substantial shortening of the circuit distance and thus to deterioration in intercircuit insulating performance. And, fluctuation of the residual plating amount results in deterioration in the yield of the printed wiring board.

Examples of the inorganic fillers (E) include known inorganic fillers traditionally blended to epoxy resin compositions, and typical examples thereof include spherical silica, aluminum hydroxide and the like. Among them, aluminum hydroxide, which is superior in flame resistance, is used particularly favorably.

The content of the inorganic filler (E) is preferably 5 to 80 parts by mass, with respect to 100 parts by mass of the total amount of the epoxy resin (A), the curing agent (B), the accelerator (C) and the phenoxy resin (D). When the content of the inorganic filler (E) is in the range above, it is possible to improve the moldability and decrease the thermal expansion coefficient of the product sufficiently.

The epoxy resin composition used in the present embodiment may contains, as needed in addition to the various components above, other additives such as a leveling agent, a deforming agent, a flame retardant and a coupling agent respectively in the ranges that do not impair the advantageous effects of the invention.

The epoxy resin composition used in the present embodiment can be prepared by blending the various components above and agitating the mixture uniformly, for example, in a mixer or blender.

The epoxy resin composition thus obtained preferably contains phosphorus atoms in an amount of 0.6 to 2 mass %, with respect to the residue excluding the inorganic filler (E), in terms of improvement in the balance among flame resistance, peel strength and heat resistance.

An epoxy resin composition varnish is prepared by dissolving or dispersing the resulting epoxy resin composition in a solvent.

Examples of the solvents for use include methylethylketone, methoxypropanol, cyclohexanone and the like. These solvents may be used alone or in combination of two or more. Among them, in particular, a solvent containing cyclohexanone in an amount of 20 mass % or more is preferable, because it gives a surface-smooth prepreg which is resistant to uneven deposition of the resin on the surface of the prepreg prepared.

Subsequent impregnation of a substrate for preparation of prepreg (a prepreg-forming substrate) with the resin varnish prepared and subsequent drying of the substrate under heat in a dryer at 150 to 180° C. for 2 to 10 minutes gives a prepreg in the semi-hardened state (B stage).

Typical examples of the prepreg-forming substrates include glass fiber cloths such as glass cloth, glass paper and glass mat, Kraft paper, linter paper, natural fiber cloths, organic fiber cloths and the like.

The thickness of the prepreg-forming substrate is preferably 15 to 200 μm, more preferably 15 to 100 μm, in terms of reduction in size and thickness of the printed wiring board and yet preservation of the favorable rigidity thereof.

The content of the resin composition in the prepreg is preferably 35 to 80 mass %.

The prepreg thus obtained is used favorably as an insulator substrate having an external layer circuit formed by the method of forming a circuit by plating process or as an internal layer material carrying an internal layer circuit formed.

Hereinafter, the method of producing a multilayer circuit board prepared by using the prepreg in the present embodiment will be described.

First as shown in FIG. 1A, the prepreg 1 obtained in the present embodiment is press-molded under heat, as it is laminated onto the two surfaces of an internal layer circuit board 2 carrying an internal layer circuit 2a formed thereon, to give a multilayer circuit board 3. As for the condition of the heat pressurization molding, the temperature is preferably 160 to 180° C., the mold pressure being 1.5 to 4.0 MPa, and the period being 30 to 120 minutes.

Figure 1B:
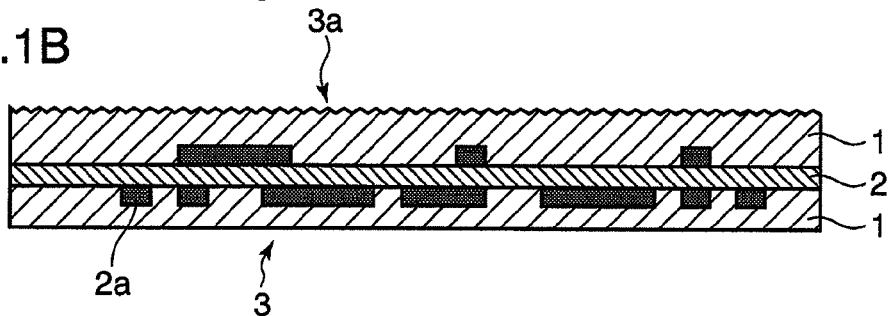

Then as shown in FIG. 1B, the surface 3a of the multilayer circuit board 3 is roughened with an oxidizing agent such as potassium permanganate. The roughening treatment is performed to improve the adhesiveness to the electroless plating layer formed on the surface 3a of the multilayer circuit board 3.

The roughening treatment is carried out, for example, by the method shown below.

The multilayer circuit board 3 is immersed in "Circuposit MLB211" produced by Sibley, mainly containing aqueous ethylene glycol solution as the principal component, for swelling the phenoxy resin (D). It is immersed additionally in "Enplate MLB497" produced by Meltex Inc. which is an aqueous solution containing potassium permanganate and sodium hydroxide as the principal components. Because the permanganate salt such as potassium or sodium permanganate functions as a strong oxidizing agent under basic condition, the phenoxy resin (D) is dissolved by the immersion. It is immersed additionally in "Enplate MLB-791M" produced by Meltex Inc. which is an aqueous solution containing sulfuric acid and hydrogen peroxide as the principal components, and then neutralized for termination of the solubilization reaction. The solution temperature and the immersion period during each immersion above are set respectively, for example, in the ranges of 40 to 90° C. and 1 to 30 minutes.

Figure 1C:
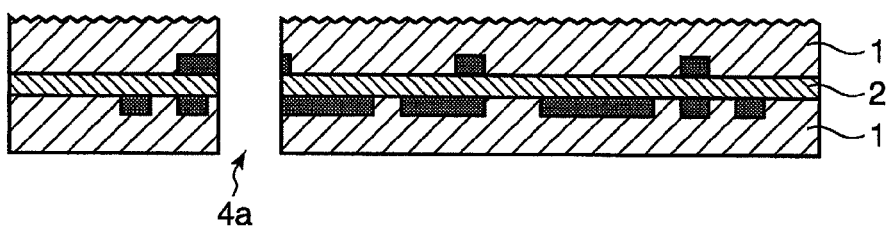

Then as shown in FIG. 1C, a hole 4a for forming a through hole 4 is formed in the surface-roughened multilayer circuit board 3. The hole is formed by drilling or laser processing.

Figure 1D:
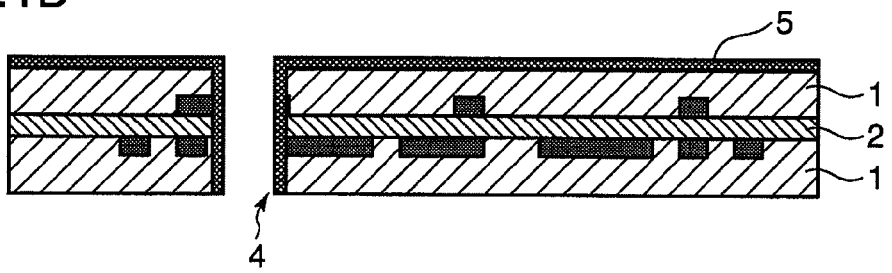

As shown in FIG. 1D, the multilayer circuit board 3 having the hole is subjected to electroless plating treatment. It gives the through hole 4 with a conductive surface of the hole 4a. It simultaneously gives an electroless plating layer 5 formed on the surface of the multilayer circuit board 3.

The thickness of the electroless plating layer 5 is preferably, approximately 0.2 to 1 μm, more preferably 0.2 to 0.5 μm. The thickness of the electroless plating layer 5 in the range above is favorable, because the yield of the board is particularly high.

Figure 2A:
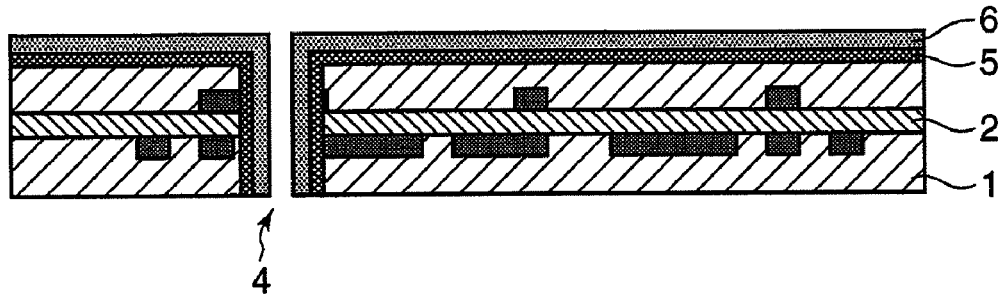
FIGS. 2A to 2D are schematic cross-sectional views showing the latter steps of the multilayer process for production of the printed wiring board in the embodiment of the present invention.

Then as shown in FIG. 2A, an electrolytic plating layer 6 is formed on the electroless plating layer 5. The thickness of the electrolytic plating layer 6 is preferably, approximately 10 to 30 μm, more preferably 15 to 25 μm. The thickness of the electroless plating layer 5 in the range above is preferable, because the yield of the board is particularly high.

Figure 2B:
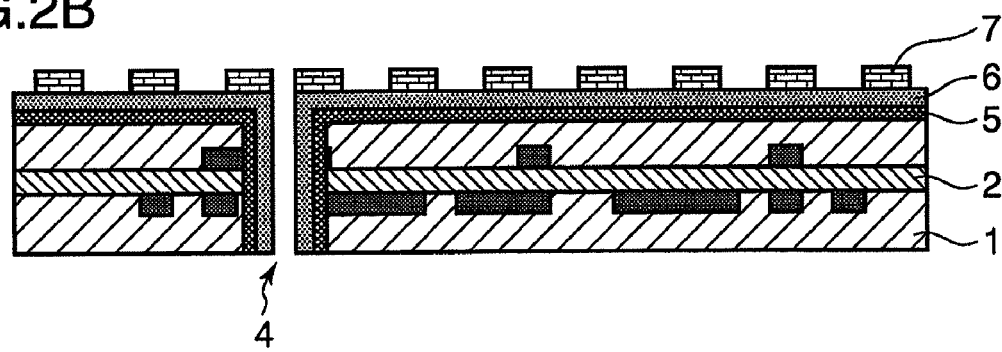
Figure 2C:
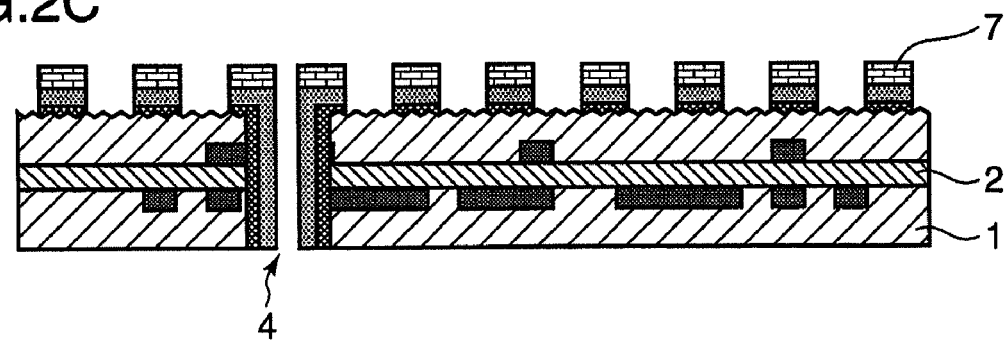
Figure 2D:
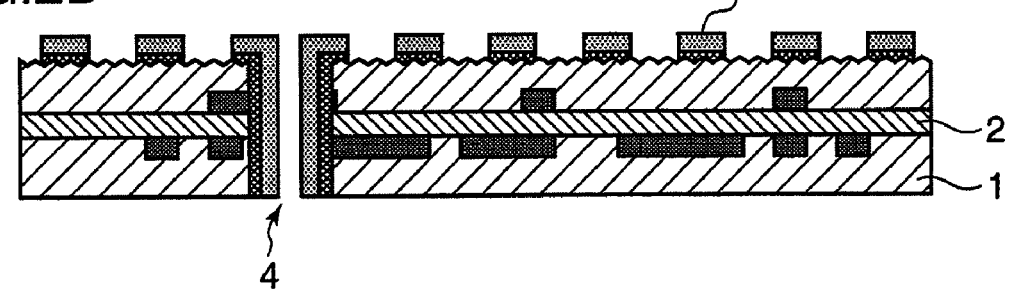

As shown in FIG. 2B, a resist 7 is formed in the circuit-forming region on the electrolytic plating layer 6. As shown in FIG. 2C, regions of the electrolytic plating layer 6 and the electroless plating layer 5 on which the resist 7 is not formed are removed by etching. Finally as shown in FIG. 2D, the resist 7 is removed by solubilization, for example, with alkaline solution, to give a multilayer printed wiring board 10 having an external layer circuit 8 formed thereon.

The multilayer printed wiring board thus obtained gives high density circuits at high yield in mass production, even when it is used for production of high-density circuits for example having a line width of 50 μm or less and a wire distance of 50 μm or less.

Hereinafter, the present invention will be described more specifically with reference to Examples. However, it should be understood that the present invention is not restricted at all by these Examples.

EXAMPLES

Examples 1 to 12 and Comparative Examples 1 to 2

First, raw materials used in the Examples are summarized below.

(Epoxy Resins (A))
    FX289ZA: phosphorus-modified epoxy resin, produced by Tohto Kasei Co., Ltd., epoxy equivalence: 331 g/eq, phosphorus atom content: 3.0 mass %
    YDF170: bisphenol F-type epoxy resin, produced by Thto Kasei Co., Ltd., epoxy equivalence: 170 g/eq
    YX4000H: biphenyl-type epoxy resin, produced by Japan Epoxy Resins Co., Ltd., epoxy equivalence: 185 g/eq
(Curing Agents (B))
    VH4170: bisphenol A novolak resin, produced by Dainippon Ink and Chemicals, Inc., hydroxyl group equivalence: 118 g/eq, resin softening point: 105° C., bifunctional bisphenol A content: 25 mass %
    XL-225L: phenol aralkyl resin, produced by Mitsui Chemicals, Inc. Co., Ltd., hydroxyl group equivalence: 171 to 179 g/eq, softening point: 75 to 80° C.
    HF-1: phenol novolak resin, produced by Meiwa Plastic Industries, Ltd., hydroxyl group equivalence: 106 g/eq, softening point: 84° C.
(Accelerator (C))
    2-Ethyl-4-methylimidazole (2E4MZ-CN)
(Phenoxy Resins (D))
    ERF-001: phosphorus-modified phenoxy resin, produced by Tohto Kasei Co., Ltd.
    RX200: phenoxy resin (D2) having the skeleton(s) represented by General Formula (1) and/or represented by General Formula (2), produced by Taiyo Ink Mfg. Co., Ltd.
(Inorganic Fillers)
    Aluminum hydroxide having an average particle diameter of 4 μm, produced by Sumitomo Co., Ltd., CL303 M
    Aluminum hydroxide having an average particle diameter of 3 μm, produced by Showa Denko K.K. Co., Ltd., HP360
    Aluminum hydroxide having an average particle diameter of 1 μm, produced by Showa Denko KK. Co., Ltd., H421
    Aluminum hydroxide having an average particle diameter of 0.8 μm, produced by Showa Denko K.K. Co., Ltd., H43
(Solvent)
    mixed solvent of methylethylketone, methoxypropanol and cyclohexanone (45:10:45)
<Preparation of Resin Varnishes>

Resin varnishes were prepared in the following manner.

A epoxy resin component and a curing agent component were blended in the blending ratio shown in Table 1 or 2, and 100 parts by mass of the blend thus obtained was added to 80 parts by mass of the solvent. The mixture was homogenized by agitation in a disper for 1 hour. An accelerator and an inorganic filler were added to the solvent in the blending ratio shown in Table 1 or 2. The mixture was agitated in the disper additionally for 1 hour to give a resin varnish.

<Preparation of Prepregs>

A glass cloth ("1035-type cloth, thickness: 30 μm", produced by Nitto Boseki Co., Ltd.) was impregnated with the resin varnish prepared above, at room temperature. The glass cloth was then heated at approximately 130 to 170° C. for removal of the solvent in varnish by drying, to give a prepreg 11 in which the resin composition is semi-hardened. The prepreg is adjusted to contain the glass cloth at a rate of 30 mass % and the resin composition at a rate of 70 mass %.

<Preparation of Multilayer Printed Circuit Boards>

Multilayer printed circuit boards were prepared in the following manner by using the prepregs 11 obtained.

Figure 3A:
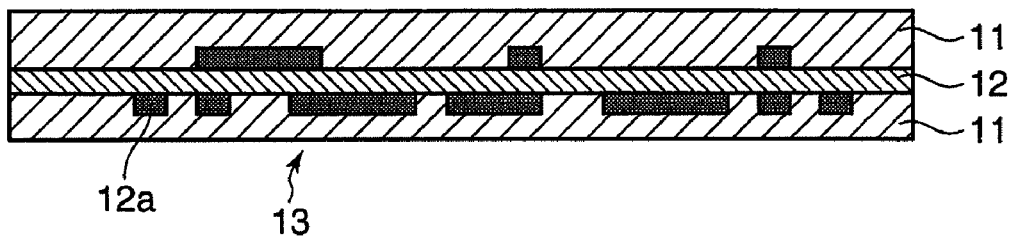
FIGS. 3A to 3D are schematic cross-sectional views showing the earlier steps of the multilayer process for production of the printed wiring board in an embodiment.

As shown in FIG. 3A, the prepreg 11 was placed on the two surfaces of the internal layer circuit board 12 carrying an internal layer circuit 12a formed thereon, and the laminate was molded under heat and pressure to give a multilayer circuit board 13. The heat pressure molding was carried out under the condition of a mold temperature of 180° C. and a mold pressure of 30 Kgf/cm$^2$ (approximately 2.9 MPa) for 60 minutes.

Figure 3B:
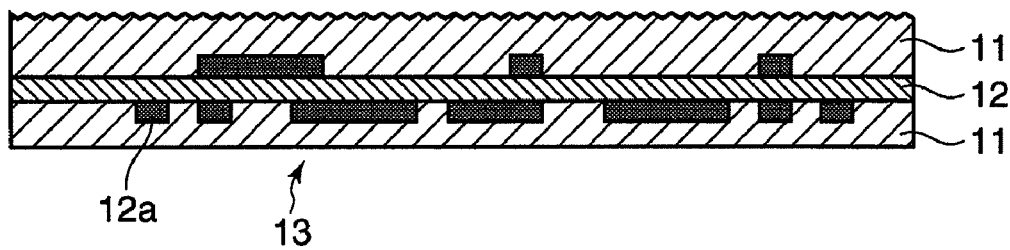

Then as shown in FIG. 3B, the multilayer circuit board 13 obtained was surface-roughened. The roughening treatment was carried out by the method shown below. The circuit board is immersed in the solution of "Circuposit MLB211" produced by Sibley at 75° C. for 6 minutes, then in the solution "Enplate MLB497" produced by Meltex Inc. at 80° C. for 10 minutes, and additionally in "Enplate MLB-791 M" produced by Meltex Inc. at 40° C. for 5 minutes.

Figure 3C:
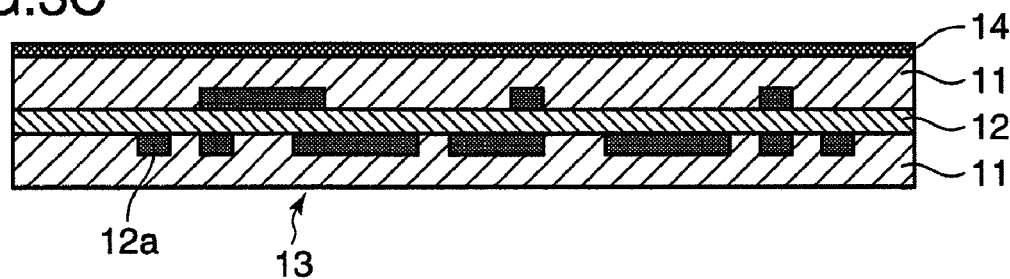

As shown in FIG. 3C, electroless copper plating treatment of the roughening-treated multilayer circuit board 13 gave an electroless copper plating layer 14 having a thickness of 0.5 μm formed on the surface of the multilayer circuit board 13.

Figure 3D:
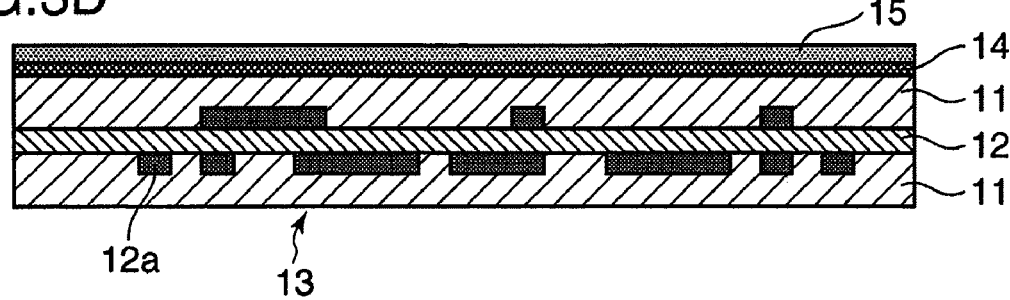

Then as shown in FIG. 3D, the electrolysis copper plating treatment on the electroless copper plating layer 14 gave an electrolysis copper plating layer 15 having a thickness of 20 μm.

Figure 4A:
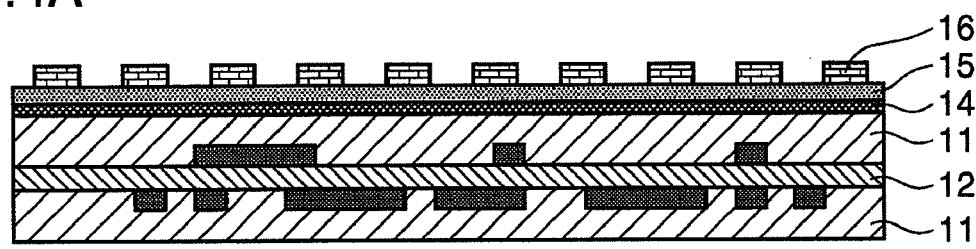
FIG. 4A to 4C are schematic cross-sectional views showing the latter steps of the multilayer process for production of the printed wiring board in the embodiment.
Figure 4B:
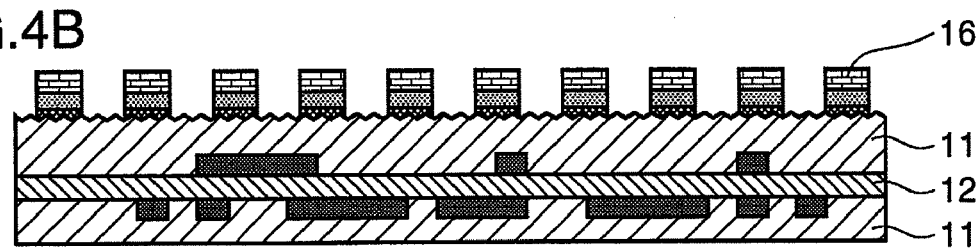
Figure 4C:
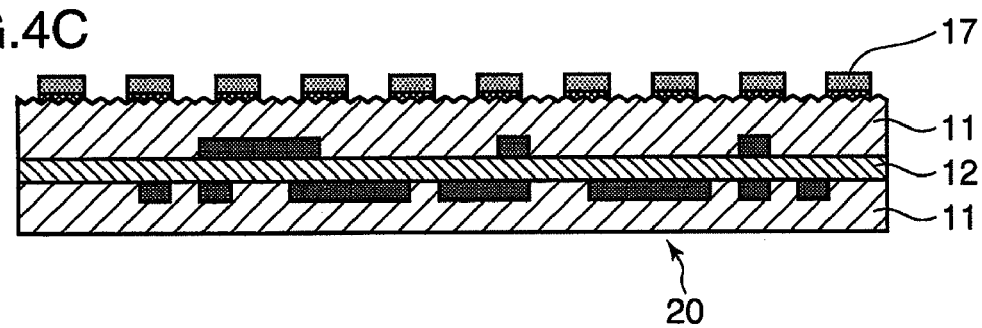

As shown in FIG. 4A, the circuit-forming region on the electrolytic plating layer 15 was protected with a resist 16. As shown in FIG. 4B, regions of the electroless plating layer 14 and the electrolytic plating layer 15 which were not protected with the resist 16 were etched. As shown in FIG. 4C, removal of the resist 16 by solubilization with an alkaline solution gave a multilayer printed wiring board 20 having an external layer circuit 17 formed thereon. The shape of the circuit pattern of the external layer circuit 17 formed was altered according to the evaluation methods described below.

Figure 5:
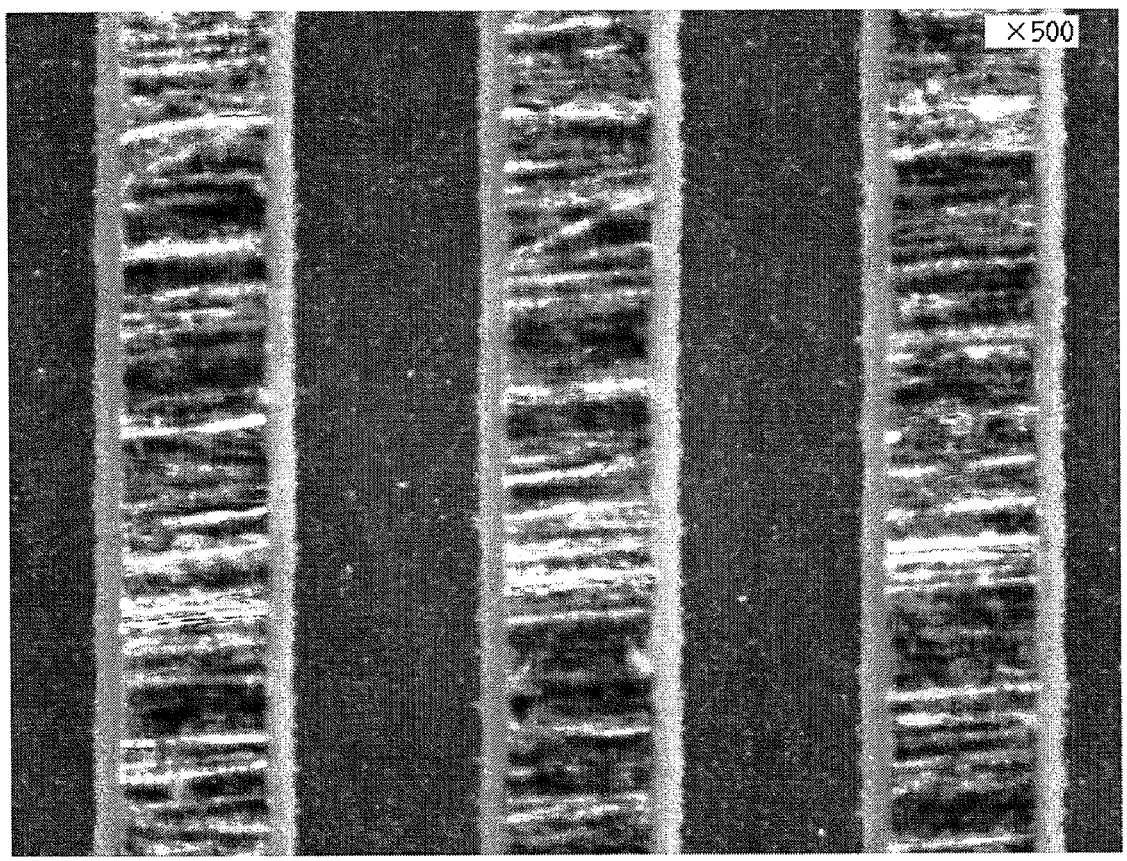
FIG. 5 is a micrograph of the multilayer printed wiring board obtained in Example 1 at a 500-fold magnification.
Figure 6:
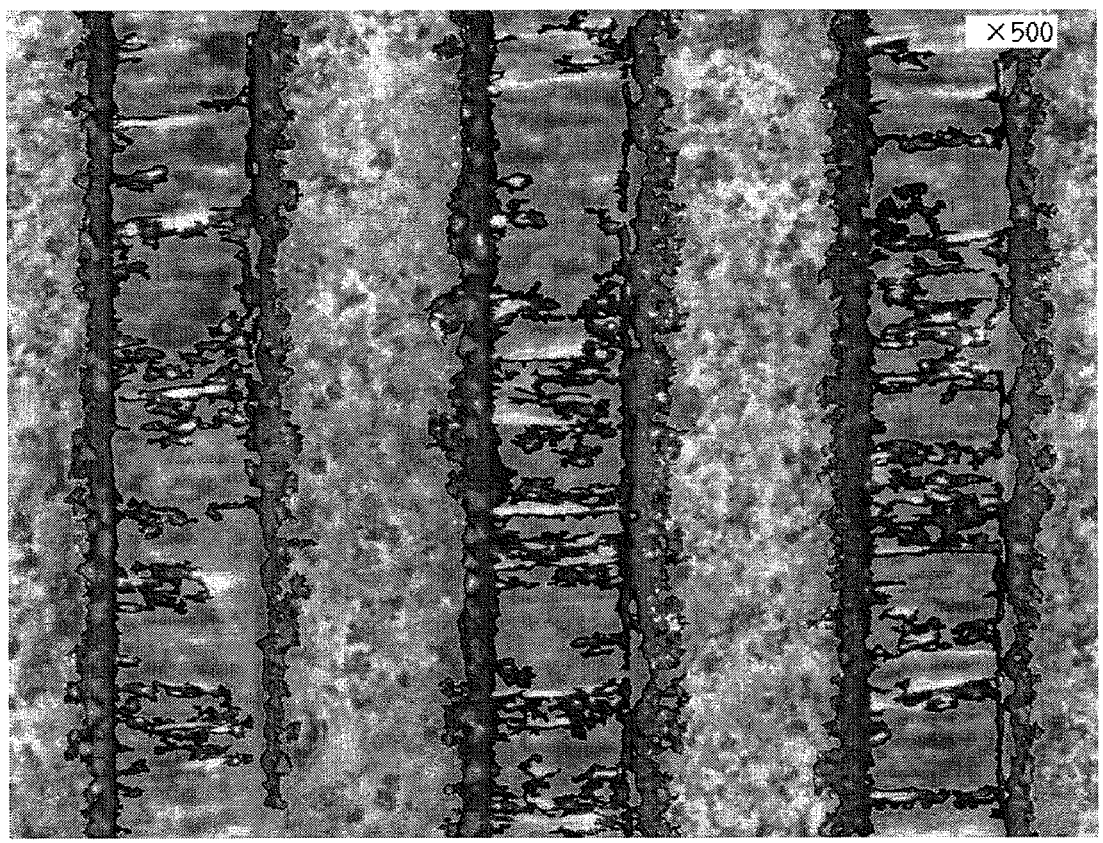
FIG. 6 is a micrograph of the multilayer printed wiring board obtained in Comparative Example 1 at a 500-fold magnification.
Figure 7:
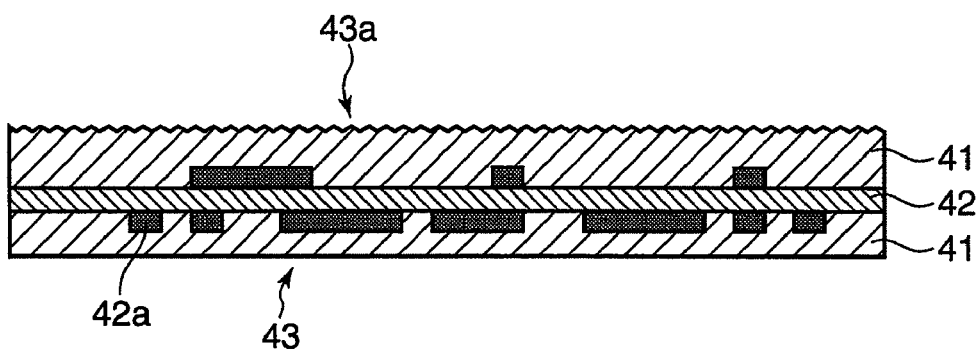
FIGS. 7A to 7D are schematic cross-sectional views showing the earlier steps of the conventional multilayer process for manufacturing a printed wiring board.
Figure 7:
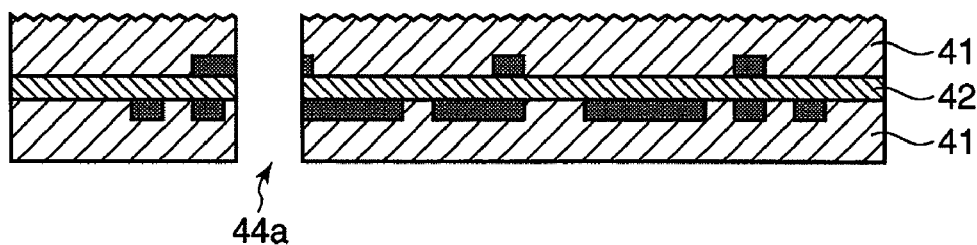
Figure 7:
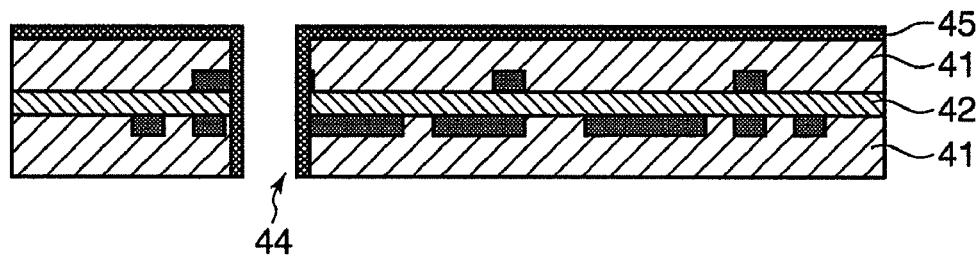
Figure 7:
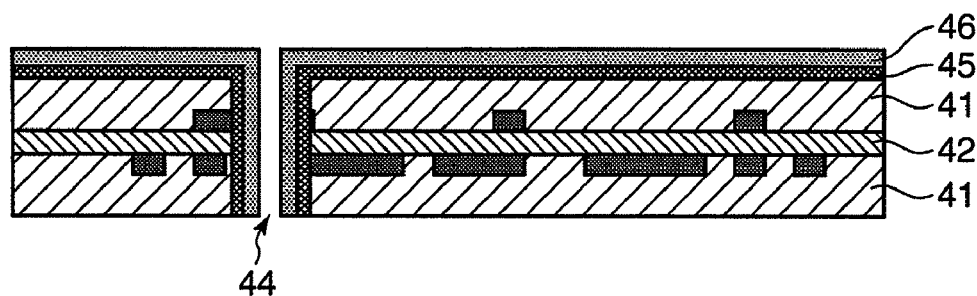
Figure 8:
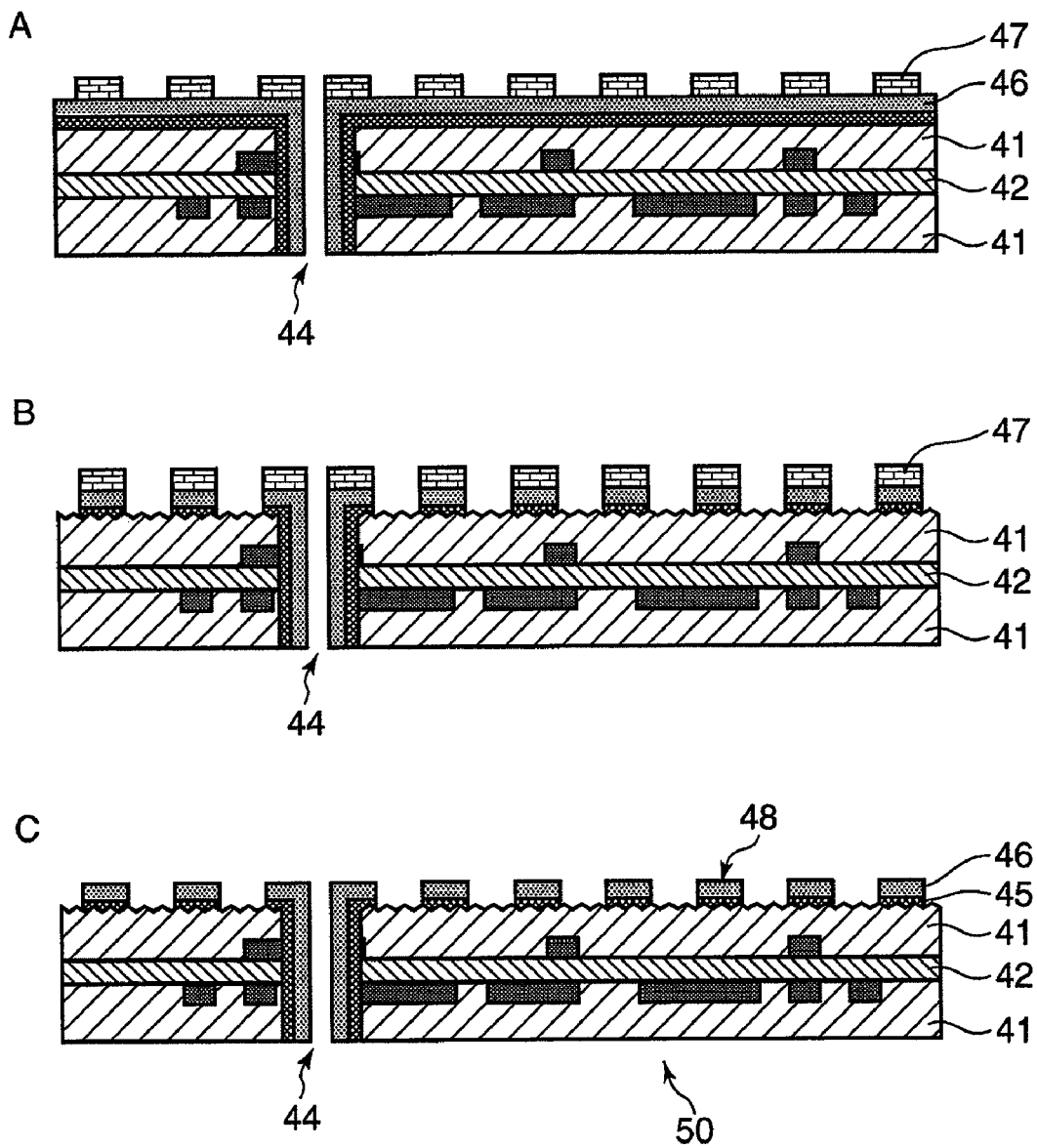
FIG. 8A to 8C are schematic cross-sectional views showing the latter steps of the conventional multilayer process for manufacturing the printed wiring board.

Photographs of the circuits on the multilayer printed wiring boards obtained in Example 1 and Comparative Example 1, which were observed under optical microscope at a 500-fold magnification, are shown in FIGS. 5 and 6.

The multilayer printed wiring boards 30 thus obtained were evaluated by the following evaluation methods.

[Circuit Yield]

The resistance between the positive and negative electrodes in a comb-shaped circuit pattern having a line width of 25 μm, in which the positive and negative electrodes were formed at a consistent inter-circuit distance of 25 μm, was determined by using an ultrainsulation resistance meter. Among 20 boards examined, those having a resistance of $10 \times 10^{10}$ or more were chosen as satisfactory, and the rate of the acceptable products was determined.

[Peel Strength]

A circuit having a line width of 10 mm was prepared and the peel strength of the circuit was determined by using a tensile tester. The peel strength of five circuits was determined, and the average was calculated.

[Glass Transition Temperature]

The glass transition temperature (Tg) of the multilayer printed wiring boards obtained was determined by the DMA method (dynamic mechanical analysis) according to JIS C6481.

[Dielectric Constant and Dielectric Dissipation Factor]

The dielectric constant and the dielectric dissipation factor at 1 MHz were determined by the bridge method according to JIS C 6481. The dielectric constant and the dielectric dissipation factor at 1 GHz were determined by using a dielectric constant tester manufactured by KEAD Co., Ltd. by cavity resonator perturbation method.

Evaluation results on the test items above are summarized in Tables 1 and 2.

TABLE 1

| | | | 1 | 2 | 3 | 4 | 5 | 6 | 7 |
|---|---|---|---|---|---|---|---|---|---|
| RESIN COMPOSITION (PARTS BY MASS) | EPOXY RESIN (A) | PHOSPHORUS-MODIFIED EPOXY RESIN (FX289ZA) | 55 | 55 | 55 | 55 | 55 | — | 57 |
| | | BISPHENOL F TYPE (YDF170) | 10 | 10 | 10 | 10 | 10 | 11 | 11 |
| | | BIPHENYL TYPE (YX4000H) | — | — | — | — | — | 52 | — |
| | CURING AGENT (B) | BISPHENOL A-TYPE NOVOLAK RESIN (VH4170) | — | — | — | 25 | 9 | — | — |
| | | PHENOL ARALKYL RESIN (XL-225L) | — | — | — | — | 16 | — | — |
| | | PHENOL NOVOLAK RESIN (HF-1) | 25 | 25 | 25 | — | — | 27 | 26 |
| | ACCELERATOR (C) | 2E4MZ-CN | 0.1 | 0.1 | 0.1 | 0.1 | 0.1 | 0.1 | 0.1 |
| | PHENOXY RESIN (D) | PHOSPHORUS-MODIFIED PHENOXY RESIN (ERF-001) | 4 | 4 | 4 | 4 | 4 | 4 | — |
| | | PHENOXY RESIN (D2, RX200) | 6 | 6 | 6 | 6 | 6 | 6 | 6 |
| | INORGANIC FILLER (E) | ALUMINUM HYDROXIDE | 50 | 50 | 50 | 50 | 50 | 50 | 50 |
| | | AVERAGE PARTICLE DIAMETER [μm] | 3 | 1 | 0.8 | 1 | 1 | 1 | 1 |
| PHOSPHORUS CONTENT (MASS %) IN THE COMPOSITION EXCLUDING COMPONENT (E) | | | 1.8 | 1.8 | 1.8 | 1.8 | 1 | 0.1 | 1.7 |
| EQUIVALENCE RATIO [Ep/Ph] | | | 1.35 | 1.35 | 1.35 | 1.35 | 1.35 | 1.35 | 1.35 |
| EVALUATION RESULTS | CIRCUIT YIELD [%] | | 90 | 95 | 100 | 100 | 95 | 100 | 100 |
| | PEEL STRENGTH [N/cm] | | 9.3 | 8.6 | 8.4 | 9.7 | 9.8 | 7.1 | 7.7 |
| | TG (DMA) [° C.] | | 161 | 161 | 161 | 160 | 162 | 166 | 163 |
| | DIELECTRIC CONSTANT (1 MHz) | | 4.5 | 4.5 | 4.5 | 4.6 | 4.5 | 4.6 | 4.5 |
| | DIELECTRIC CONSTANT (1 GHz) | | 4.3 | 4.3 | 4.3 | 4.4 | 4.3 | 4.4 | 4.3 |
| | DIELECTRIC DISSIPATION FACTOR (1 MHz) | | 0.010 | 0.010 | 0.010 | 0.010 | 0.010 | 0.011 | 0.010 |
| | DIELECTRIC DISSIPATION FACTOR (1 GHz) | | 0.013 | 0.013 | 0.013 | 0.014 | 0.013 | 0.019 | 0.014 |
| | FLAME RESISTANCE (UL94) | | V-0 | V-0 | V-0 | V-0 | V-0 | V-1 | V-0 |

TABLE 2

| | | | 8 | 9 | 10 | 11 | 12 | COMPARATIVE EXAMPLE 1 | COMPARATIVE EXAMPLE 2 |
|---|---|---|---|---|---|---|---|---|---|
| RESIN COMPOSITION (PARTS BY MASS) | EPOXY RESIN (A) | PHOSPHORUS-MODIFIED EPOXY RESIN (FX289ZA) | 58 | 58 | 52 | 15 | 62 | 55 | 55 |
| | | BISPHENOL F TYPE (YDF170) | 11 | 11 | 9 | 60 | 7 | 10 | 10 |
| | | BIPHENYL TYPE (YX4000H) | — | — | — | — | — | — | — |
| | CURING AGENT (B) | BISPHENOL A-TYPE NOVOLAK RESIN (VH4170) | — | — | — | — | — | — | — |
| | | PHENOL ARALKYL RESIN (XL-225L) | — | — | — | — | — | — | — |
| | | PHENOL NOVOLAK RESIN (HF-1) | 27 | 27 | 23 | 19 | 21 | 25 | 25 |
| | ACCELERATOR (C) | 2E4MZ-CN | 0.1 | 0.1 | 0.1 | 0.1 | 0.1 | 0.1 | 0.1 |
| | PHENOXY RESIN (D) | PHOSPHORUS-MODIFIED PHENOXY RESIN (ERF-001) | 4 | 3 | 4 | 2 | 4 | 4 | 4 |
| | | PHENOXY RESIN (D2, RX200) | — | 1 | 12 | 4 | 6 | 6 | 6 |
| | INORGANIC FILLER (E) | ALUMINUM HYDROXIDE | 50 | 50 | 50 | 50 | 50 | 50 | 30 |
| | | AVERAGE PARTICLE DIAMETER [μm] | 1 | 1 | 1 | 1 | 1 | 4 | 4 |
| PHOSPHORUS CONTENT (MASS %) IN THE COMPOSITION EXCLUDING COMPONENT (E) | | | 1.9 | 1.8 | 1.7 | 0.5 | 2.1 | 1.8 | 1.8 |
| EQUIVALENCE RATIO [Ep/Ph] | | | 1.35 | 1.35 | 1.35 | 1.35 | 1.35 | 1.35 | 1.35 |
| EVALUATION RESULTS | CIRCUIT YIELD [%] | | 100 | 100 | 100 | 100 | 100 | 60 | 60 |
| | PEEL STRENGTH [N/cm] | | 7.2 | 6.8 | 6.2 | 7.6 | 6.5 | 9.6 | 8.8 |
| | TG (DMA) [° C.] | | 165 | 165 | 157 | 164 | 158 | 161 | 161 |
| | DIELECTRIC CONSTANT (1 MHz) | | 4.5 | 4.5 | 4.6 | 4.6 | 4.6 | 4.5 | 4.5 |
| | DIELECTRIC CONSTANT (1 GHz) | | 4.3 | 4.3 | 4.4 | 4.4 | 4.4 | 4.3 | 4.3 |
| | DIELECTRIC DISSIPATION FACTOR (1 MHz) | | 0.010 | 0.010 | 0.010 | 0.011 | 0.011 | 0.010 | 0.010 |
| | DIELECTRIC DISSIPATION FACTOR (1 GHz) | | 0.022 | 0.021 | 0.012 | 0.019 | 0.018 | 0.013 | 0.014 |
| | FLAME RESISTANCE (UL94) | | V-0 | V-0 | V-0 | V-1 | V-0 | V-0 | V-0 |

Comparison between the results in Examples 1 to 12 and those in Comparative Examples 1 and 2 shows the followings: The circuit yields of the multilayer printed wiring boards obtained by using the prepregs in Examples 1 to 12, which contain aluminum hydroxide having an average particle diameter of 0.8 to 3 μm, were in the range of 90 to 100%. On the other hand, the circuit yields of the multilayer printed wiring board obtained by using the prepregs in Comparative Example 1 and 2, which contain aluminum hydroxide having an average particle diameter of 4 μm, were respectively 60%, which is significantly smaller. As shown in FIGS. 5 and 6, when the prepreg of Comparative Example 1 is used, the plating remains on the periphery of the circuit formed by etching, leading to fluctuation in the residual amount of the plating which causes fluctuation in inter-circuit insulation resistance, and thus to decrease in yield of the printed wiring board.

Alternatively, comparison of the results in Examples 1 to 3 with each other reveals that the yield increased as the average particle diameter of aluminum hydroxide used was reduced.

In Example 6, wherein the phosphorus-modified epoxy resin was replaced with a biphenyl-type epoxy resin, the circuit yield was excellent, but the peel strength and the flame resistance declined slightly. Alternatively, in Examples 8 and 9 using the resin compositions, which contain no or few phenoxy resin (D2) having the skeleton(s) represented by General Formula (1) and/or General Formula (2), an elevated dielectric dissipation factor at 1 GHz was observed. In Examples 6 and 11 using the resin compositions, which contain a smaller amount of phosphorus atoms, the flame resistance was evaluated as V-1, while in Example 12, in which the resin composition contains a greater amount of phosphorus atoms, slightly lower peel strength was observed.

As described above in detail, an aspect of the present invention is a prepreg, obtained by impregnating a base material with an epoxy resin composition containing an epoxy resin (A), a curing agent (B), an accelerator (C), a phenoxy resin (D), and an inorganic filler (E) and semi-hardening the impregnated material, wherein the inorganic filler (E) has an average particle diameter of 3 µm or less. If a circuit with a narrow wire distance is formed on the surface of the insulator substrate composed of such a prepreg by using the method of forming a circuit by plating process, the amount of the plating remaining on the insulator substrate surface at the circuit contour periphery can be reduced. As a result, it leads to decrease in fluctuation of the inter-circuit insulation resistance and increase in the yield of the printed wiring board.

In addition, the inorganic filler (E) preferably contains aluminum hydroxide, because a prepreg superior in flame resistance can be obtained.

The epoxy resin (A) in the prepreg above is preferably a phosphorus-modified epoxy resin (A1), because it is possible to assure favorable flame resistance without use of halogen compounds higher in environmental load.

In addition, the phenoxy resin (D) is preferably a phosphorus-modified phenoxy resin (D1), in terms of the favorable balance among peel strength, flame resistance and heat resistance.

The phenoxy resin (D) is preferably a phenoxy resin (D2) having the skeleton(s) represented by General Formula (1) and/or General Formula (2), in terms of the favorable dielectric dissipation factor in the high-frequency region.

The content of the phenoxy resin (D) in the epoxy resin composition excluding the inorganic filler (E) is preferably 5 to 15 mass %, for sufficient improvement in peel strength without significant deterioration in heat resistance.

The content of the phosphorus atom in the epoxy resin composition excluding the inorganic filler (E) is preferably 0.6 to 2 mass %, from the point of the favorable balance among flame resistance, peel strength and heat resistance.

The content of the inorganic filler (E) in the entire epoxy resin composition is preferably 5 to 80 mass %, from the favorable balance between flame resistance and peel strength.

An aspect of the present invention is a multilayer circuit board obtained by lamination molding of the prepreg above with an internal-layer circuit board. The printed wiring board obtained by using such a multilayer circuit board has a high rate in the yield during mass production.

Another aspect of the present invention is a printed wiring board using the prepreg above as an insulation layer. Such a printed wiring board has a high rate in the yield during mass production.

Yet another aspect of the present invention is a process for manufacturing a printed wiring board, comprising a step of forming a laminated film by piling at least one layer of internal layer circuit board and multiple layers of prepregs while placing the prepreg according to any one of Claims 1 to 8 as the outermost layer and processing the laminate under heat and pressure, a roughening step of roughening the surface of the laminated film, and a plating step of forming an plating layer on the roughened surface by electroless plating. It is possible by such a production method to mass-produce a printed wiring board having an external layer circuit with narrow circuit width and circuit distance at a high yield.

What is claimed is:

1. A prepreg, obtained by impregnating a base material with an epoxy resin composition containing an epoxy resin (A), a curing agent (B), an accelerator (C), a phenoxy resin (D), and an inorganic filler (E) and semi-hardening the impregnated material, wherein the inorganic filler (E) has an average particle diameter of 3 µm or less, and wherein the phenoxy resin (D) contains a phenoxy resin (D2) having the skeleton(s) represented by the following General Formula (1) and/or General Formula (2):

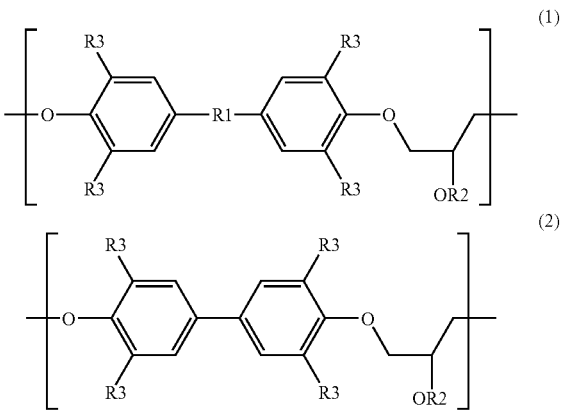

(in Formulae (1) and (2), R1 represents an alkylene group or —$SO_2$—; R2 represents a linear or cyclic carbonyl group having a carbon number of 1 to 20 or aromatic carbonyl group at a rate of 5 to 99 mol % and a hydrogen atom at a rate of 1 to 95 mol %; and R3 represents a hydrogen atom or a methyl group).

2. The prepreg according to claim 1, wherein the inorganic filler (E) contains aluminum hydroxide.

3. The prepreg according to claim 1, wherein the epoxy resin (A) contains a phosphorus-modified epoxy resin (A1).

4. The prepreg according to claim 1, wherein the phenoxy resin (D) further contains a phosphorus-modified phenoxy resin (D1).

5. The prepreg according to claim 1, wherein the phenoxy resin (D) is in an amount of 5 to 15 mass % in the epoxy resin composition excluding the inorganic filler (E).

6. The prepreg according to claim 1, wherein phosphorus atoms in the epoxy resin composition excluding the inorganic filler (E) is in an amount of 0.6 to 2 mass %.

7. The prepreg according to claim 1, wherein the inorganic filler (E) in the entire epoxy resin composition is in an amount of 5 to 80 mass %.

8. A multilayer circuit board, obtained by lamination molding of the prepreg according to claim 1 and an internal-layer circuit board.

9. A printed wiring board, comprising the prepreg according to claim 1 using as an insulation layer.

10. A process for manufacturing a printed wiring board, comprising a step of forming a laminated film by piling at least one layer of internal layer circuit board and multiple layers of prepregs while placing the prepreg according to claim 1 as the outermost layer and processing the laminate under heat and pressure, a roughening step of roughening the surface of the laminated film, and a plating step of forming a plating layer on the roughened surface by electroless plating.

* * * * *